United States Patent [19]

Bailey

[11] Patent Number: 5,737,114
[45] Date of Patent: Apr. 7, 1998

[54] LABEL HAVING AN INCORPORATED ELECTROCHROMIC STATE-OF-CHARGE INDICATOR FOR AN ELECTROCHEMICAL CELL

[75] Inventor: John C. Bailey, Columbia Station, Ohio

[73] Assignee: Eveready Battery Company, Inc., St. Louis, Mo.

[21] Appl. No.: 453,700

[22] Filed: May 30, 1995

Related U.S. Application Data

[63] Continuation-in-part of Ser. No. 396,505, Nov. 8, 1994, which is a continuation-in-part of Ser. No. 246,926, May 20, 1994, Pat. No. 5,458,992, which is a continuation of Ser. No. 648,080, Jan. 31, 1991, abandoned.

[51] Int. Cl.$^6$ .................................................. G02F 1/153
[52] U.S. Cl. .................... 359/268; 359/265; 359/266; 359/267; 359/269; 359/270; 359/271; 359/272; 359/273; 359/274
[58] Field of Search .................................. 359/265–274

[56] References Cited

U.S. PATENT DOCUMENTS

| | | | |
|---|---|---|---|
| 945,564 | 1/1910 | Marko | 429/92 |
| 1,497,388 | 6/1924 | Sterling | 429/50 |
| 2,988,590 | 6/1961 | André | 429/93 |
| 3,280,701 | 10/1966 | Donnelly et al. | 359/267 |
| 3,667,039 | 5/1972 | Garfein et al. | 324/92 |
| 4,304,465 | 12/1981 | Diaz | 359/273 |
| 4,379,816 | 4/1983 | Mullersman et al. | 429/91 |
| 4,442,187 | 4/1984 | MacDiarmid et al. | 429/213 |
| 4,497,881 | 2/1985 | Bertolino | 429/91 |
| 4,680,527 | 7/1987 | Benenati et al. | 320/2 |
| 4,702,563 | 10/1987 | Parker | 359/44 |
| 4,702,564 | 10/1987 | Parker | 359/44 |
| 4,723,656 | 2/1988 | Kiernan et al. | 206/705 |
| 4,726,661 | 2/1988 | Parker | 359/44 |
| 4,737,020 | 4/1988 | Parker | 359/87 |
| 4,801,514 | 1/1989 | Will et al. | 429/167 |
| 4,835,475 | 5/1989 | Hanakura et al. | 324/435 |
| 4,835,476 | 5/1989 | Kurosawa | 324/432 |
| 4,902,108 | 2/1990 | Byker | 359/265 |
| 4,911,994 | 3/1990 | Will et al. | 429/167 |
| 4,917,973 | 4/1990 | Yoshimoto et al. | 429/91 |
| 4,940,640 | 7/1990 | MacDiarmid | 429/213 |
| 5,015,544 | 5/1991 | Burroughs et al. | 429/93 |
| 5,059,895 | 10/1991 | Cataldi et al. | 324/104 |
| 5,156,931 | 10/1992 | Burroughs et al. | 429/93 |

(List continued on next page.)

FOREIGN PATENT DOCUMENTS

| | | |
|---|---|---|
| 497616A2 | 8/1992 | European Pat. Off. . |
| 501609A1 | 9/1992 | European Pat. Off. . |
| 60-66170 | 4/1985 | Japan . |
| 63-179269 | 7/1988 | Japan . |
| 2-41365 | 9/1988 | Japan . |
| 63-213256 | 9/1988 | Japan . |
| 2100269 | 4/1990 | Japan . |
| WO92/03852 | 3/1992 | WIPO . |
| WO93/06474 | 4/1993 | WIPO . |
| WO94/15246 | 7/1994 | WIPO . |

OTHER PUBLICATIONS

"Poly(N–Benzylaniline/Poly(AMPs)/WO$_3$) Solid–State Electrochromic Cell," My T. Nguyên and Lê H. Dao, *J. Electrochem. Soc.*, 136, 2131 (1989);.

*Proceedings of the Symposium on Electrochromic Materials*, vol. 90–2, M. K. Carpenter & D.A. Corrigan, Editors, The Electrochemical Society, Inc., Princeton, N.J., 1990;.

*Large Area Chromogenics: Materials and Devices for Transmittance Control*, vol. IS4, C. M. Lampert and C. G. Granqvist, Editors, SPIC Optical Engineering Press, Belligham, Washington, 1989.

*Primary Examiner*—David C. Nelms
*Assistant Examiner*—Evelyn A. Lester
*Attorney, Agent, or Firm*—Robert W. Welsh

[57] ABSTRACT

A label for electrochemical cell employs an electrochromic material so that when the material is connected to power provided by the electrochemical cell, the material will undergo a visible change as a result of a chemical reaction.

41 Claims, 3 Drawing Sheets

U.S. PATENT DOCUMENTS

| | | | |
|---|---|---|---|
| 5,196,144 | 3/1993 | Smith et al. | 252/500 |
| 5,223,003 | 6/1993 | Tucholski et al. | 29/623.4 |
| 5,232,631 | 8/1993 | Cao et al. | 252/500 |
| 5,250,905 | 10/1993 | Kuo et al. | 324/435 |
| 5,256,500 | 10/1993 | Ishimoto | 429/93 |
| 5,332,530 | 7/1994 | Eid et al. | 252/583 |
| 5,339,024 | 8/1994 | Kuo et al. | 324/435 |
| 5,396,177 | 3/1995 | Kuo et al. | 324/435 |
| 5,413,739 | 5/1995 | Coleman | 252/511 |

LABEL HAVING AN INCORPORATED ELECTROCHROMIC STATE-OF-CHARGE INDICATOR FOR AN ELECTROCHEMICAL CELL

This application is a continuation-in-part of copending U.S. patent application Ser. No. 396,505, filed Nov. 8, 1994, (still pending), which is a continuation-in-part of U.S. patent application Ser. No. 246,926, filed May 20, 1994, now U.S. Pat. No. 5,458,992, which is a continuation of U.S. patent application Ser. No. 648,080 filed Jan. 31, 1991, now abandoned.

FIELD OF THE INVENTION

A label for electrochemical cells has a tester for the cells incorporated therein, which tester comprises an electrochromic material that will exhibit a visible change as a result of current supplied from the electrochemical cell.

BACKGROUND OF THE INVENTION

Batteries are generally stored for various periods of time before being put into use. The batteries can be stored by the seller and frequently when purchased they are again stored by the buyer prior to being put to use. It is therefore desired to have some sort of testing means for determining if a battery has sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a light absorbing material. A conductive material, which may taper outwardly in opposite directions from a central point to a pair of terminals, is then deposited on the substrate on the same side of the substrate as the absorber layer or on the opposite side of the substrate as the absorber layer. A layer of a cholesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

2

U.S. Pat. No. 5,059,895 discloses a battery voltmeter comprising:

(A) a dielectric layer;

(B) a conductive layer above or below one of the surfaces of the dielectric layer; and (C) a temperature sensitive color indicator layer in thermal contact with the conductive layer, characterized in that the conductive layer has (1) thermal insulating means under one of its surfaces and (ii) sufficient heat generating capacity to affect a change in the temperature sensitive color indicator layer. The voltmeter can be integrated into a label and attached directly to a battery.

U.S. Pat. No. 4,835,475 discloses an apparatus for indicating the electromotive force of a dry battery which comprises:

(i) a film base;

(ii) an electrically conductive layer disposed on one side of the film base, (iii) a protective layer disposed on the electrically conductive layer, and (iv) a thermochromic layer disposed on the other side of the film base.

One problem with these thermally activated testers is that they provide only an analog-type indication of the state of charge of the battery. They indicate how much heat is generated in the resistor that is placed in circuit with the battery, if there is insufficient thermal insulation, or if the ambient conditions are hot or cold, the accuracy of the tester can be in doubt.

U.S. Pat. No. 4,442,187 discloses batteries having conjugated polymer electrodes in which the conjugated polymers are doped with ionic dopant species to a preselected room temperature electrical conductivity ranging from that characteristic of semiconductor behavior to that characteristic of metallic behavior, by means of reversible electrochemical doping procedures. The electrochemical doping reactions and their reverse electrochemical undoping reactions are utilized as the charging and discharging mechanisms of lightweight secondary batteries which so employ doped or dopable conjugated polymer as one or both of their electrodes.

U.S. Pat. No. 4,940,640 discloses polyaniline electrodes in which the oxidation and hydrogenation levels of the polyaniline species of the electrodes are carefully controlled. Electrochemical cells employing these electrodes function by reversible oxidation and reduction of the polyaniline species forming the electrode.

U.S. Pat. No. 5,232,631 discloses solutions and plasticized compositions of electrically conductive substituted and unsubstituted polyanilines in nonpolar organic fluid phases with functionalized protonic acids and the use of such compositions for various applications such as conductive articles.

European Patent Application 497616-A2 discloses a tester for use in determining the voltage and state-of-charge of a battery. The tester can be permanently mounted on the battery and employs an electrochromic cell which changes visual appearance, for example, color or intensity of color when electrically connected across the terminals of a battery. The electrochromic cell undergoes an oxidation/reduction reaction on direct application of the DC potential of the battery. The color of the electrochromic cell can be compared with a color comparison chart to determine the condition of the battery. The electrochromic cell preferably comprises an electrochromic electrode that is constructed of an electrochromic material and an electrically conductive layer of a material such as indium-tin oxide, an electrolyte and a counter electrode. The tester can be permanently electrically connected to the battery or, preferably, can be connected momentarily to determine the state of the battery.

U.S. Pat. No. 5,413,739 discloses electrochromic materials and displays comprising electrically conductive particles coated with an electrochromic material. The coated particles can be applied to a support in the form of a polymeric dispersion. Laminates can be prepared from these compositions.

An object of the present invention is to provide a cell tester label employing an electrically conductive electrochromic electrode, an electrically conductive counter electrode and an ionically conductive electrolyte disposed between said electrodes.

Another object of this present invention is to provide a cell tester label that is cost effective to produce and suitable for efficient automatic assembly by using a minimum number of components.

These and other objects will be apparent from the following description.

SUMMARY OF THE INVENTION

The invention relates to a label having an incorporated state-of-charge indicator for an electrochemical cell. The electrochemical cell has a first terminal and a second terminal of opposite polarity. The indicator incorporated into the label comprises a first electrically conductive electrode adapted to electrically contact said first terminal, a second electrically conductive electrode adapted to electrically contact said second terminal, an electrochromic material in contact with at least one of the electrically conductive electrodes, and an ionically conductive electrolyte disposed between and in contact with said first and second electrically conductive electrodes. The electrochromic material will undergo a visible change at the electrode it is contacting as a result of current being supplied from the electrochemical cell.

In another aspect, this invention is a battery combined with the above-described state-of-charge indicator.

In yet another aspect, this invention is an electrochemical cell having a label with a state-of-charge indicator incorporated in the label. The electrochemical cell has first and second terminals of opposite polarity, and the label comprises a substrate. An electrically conductive electrochromic electrode is deposited on the substrate and is adapted to electrically contact the first terminal of the of the cell. An ionically conductive electrolyte is disposed in contact with the electrochromic electrode. An electrically conductive counter electrode is disposed in contact with the electrolyte and is adapted to electrically contact the second terminal of the cell. When the electrochromic electrode makes electrical contact with the first terminal of the cell and the counter electrode makes contact with the second terminal of the cell, the electrochromic electrode will exhibit a visible change as a result of a chemical reaction.

DETAILED DESCRIPTION OF THE INVENTION

The tester and labels of this invention can be in a variety of embodiments. In one embodiment, the electrochromic material is in contact with the electrically conductive electrode that is in contact with the negative terminal of the battery being tested. This electrode will thus become the working electrode in the electrochromic tester.

In another embodiment, the electrochromic material is disposed as a film or a pattern on a film or layer of one of the electrically conductive electrodes. The electrode on which the electrochromic material is disposed is the working electrode of the electrochromic tester. The other electrically conductive electrode will thereby provide the counter electrode for the electrochromic tester.

Alternatively, the electrochromic material can comprise part of a composition with the electrolyte and will thus be in contact with both electrically conductive electrodes. The electrode at which the electrochromic material will exhibit the visible change will thus be the working electrode of the electrochromic tester.

In still yet another embodiment, the electrochromic material can form part of a composite with one or both of the electrically conductive electrodes to form an electrically conductive electrochromic working electrode. As used herein, the term "electrically conductive electrochromic electrode" shall mean an electrode of an electrochromic tester that is both electrically conductive and electrochromically active, i.e., the material undergoes a visible change as a result of a chemical reaction induced by the application of an electric current or voltage. The electrically conductive electrochromic electrode can be a material that by itself is intrinsically electrically conductive and electrochromically active (i.e., an electrically conductive electrochromic material), or a substantially homogenous mixture of an electrochromic material and an electrically conductive material, or a composite of an electrochromic material and an electrically conductive material. The composites can be an electrochromic material mixed with an electrically conductive material, an electrically conductive matrix containing an electrochromic material dispersed throughout said matrix, an electrochromic material coated on electrically conductive particles, an electrically conductive material coated on electrochromic particles, or an electrically conductive material dispersed throughout an electrochromic matrix. Suitable examples are disclosed in U.S. Pat. No. 5,413,739, herein incorporated by reference.

The use of an electrically conductive electrochromic electrode avoids the use of a separate electrically conductive electrode, which can simplify the manufacturing of the labels, particularly in a high speed automated process.

The cell testing device incorporated into the label is provided for detecting and measuring the state-of-charge of a cell or battery. The test device employs electrochromic electrodes that change color (change in light absorption) as the electrodes change oxidation state, a redox-type reaction, under the influence of a DC potential applied from the battery directly to the elctrochromic electrodes. The electrochromic electrodes are preferably a solid.

Preferably, the label has a substrate on which the electrically conductive electrodes, and/or electrochromic material and/or electrolyte can be disposed. The substrate can be any thin material that can support the electrochromic material and that can function as a protective or informative covering for the electrochemical cell. A film is preferred, and can be paper or metal foil, but is more preferably a translucent or transparent polymer film. The electrically conductive electrodes and/or electrochromic material and/or electrolyte can be applied to the substate as a layer or disposed in a pattern on the substrate, such as by vapor deposition, electrolysis, coating, printing, and the like. In one preferred embodiment, an electrically conductive electrochromic material is a solid and is disposed on the substrate in the form of an electrode for the electrochromic tester. Also, it is preferred that the label be comprised of a series of layers, such as a number of substrates, films or layers of materials, with each layer having one or more of the components of the state-of-charge indicator device disposed thereon. As contemplated, the components of the indicator can be disposed one on top of the other in a stacked construction, or the electrically conductive electrodes can be disposed in a spaced apart side-by-side construction. In the stacked construction, one of the electrically conductive electrodes should preferably be transparent so that the color change in the electrochromic material can be viewed. In the side-by-side construction, both electrodes can be opaque, with the color change in the electrochromic material being viewed through a transparent substrate or film of the label.

Suitable translucent or transparent polymer or plastic films that are useful in the labels of this invention include polyester, polyvinyl chloride (PVC), polyethylene, polyvinylidene chloride and polycarbonate with PVC being the preferred material for the substrate.

The electrochromic material to be used in the cell tester device of this invention can be either an organic or an inorganic material which changes color or color intensity, that is, optical absorption, on application of a DC potential. The electrochromic electrode undergoes an oxidation/reduction reaction, commonly referred to as a redox reaction, in order to develop or change color. The optical absorptivity of the electrochromic electrode is controlled by driving the electrochromic electrode from one oxidation state to another with an external power source.

In some cases, the electrochromic material itself may not undergo the redox reaction but may react with a redox product to produce a color change. An example of such a system is the production of $OH^-$ electrochemically followed by the reaction of the $OH^-$ with an organic pH indicating dye to give a color change. This type of electrochromic system is the subject of U.S. Pat. No. 3,280,701 by J. F. Donnelly and R. C. Cooper.

The change in oxidation state of the electrochromic material can be an oxidation/reduction or redox reaction and can be the result of the direct application of a DC potential or current to the electrochromic material. Typically, the materials will require currents of about 1 $mA/CM^2$ or less to change. When the electrochromic material undergoes a visible change, this change can be a change in light absorption, change in color, or a change in shade, e.g., going from clear to opaque, or opaque to clear. The DC potential is typically provided by the electrochemical cell to which the cell tester label is applied.

Electrochromic materials which show a very large change in extinction coefficient are preferred so that very little electrode material (and hence a very small amount of current) is required to produce a visible color change. A variety of electrochromic materials are suitable for use in the labels with an incorporated state-of-charge indicators of this invention. The electrochromic materials may be organic or inorganic materials. Suitable inorganic electrochromic materials for use in this invention include $WO_3$, $MoO_3$, $TiO_2$, $SnO_2$, $Cr_2O_3$, $NiO_2$, $MnO_2$, $Mn_2O_3$ and Prussian blue which are typical of many well-known solid inorganic electrochromic materials. Such materials have been studied extensively in applications such as optical filters, one-way glass, and variable reflectance mirrors. These materials can be used in a solid form as a coating applied to, or as an ink solution which can be printed on the substrate.

Representative of suitable solid organic electrochromic materials include many macrocyclic and polycyclic materials such as substituted phthalocyanines, polypyrroles, polythiophenes and polyanilines and common dyes and redox indicators such as naphthol blue black and N,N'-diphenylbenzidine. These materials can be applied in solid form as a film, printed, or otherwise deposited on a substrate of the label, which can be a translucent or transparent plastic. An example of a solid organic material that can be polymerized electrochemically to produce a conductive electrochromic film is N-benzylaniline. The preferred electrochromic materials would be substituted and unsubstituted phthalocyanines, polyanilines, polypyrroles, and polythiophenes which are electrically conductive and therefore could be used as the sole material for the electrodes. These polymers have conjugated unsaturation in their backbone chain and preferably have an electronic conductivity of at least $10^{-3}$-S/cm or greater. A preferred electrochromic material is polyaniline which could be printed on a plastic substrate. Suitable polyanilines are disclosed in U.S. Pat. Nos. 4,940,640 and 5,232,631. The polyaniline can be doped with electrolyte salts or chemically substituted to increase its electronic conductivity. A dispersion of fine particles could be used, but a solution is preferred to obtain more uniform thin films. Useful electrochromic materials would be substituted and unsubstituted phthalocyanines, polyaniline, polypyrroles, and polythiophenes which are electrically conductive and therefore would be preferred for the working electrode. Of particular interest are modified polyanilines of the type disclosed in U.S. Pat. No. 5,196,144 which are processible either from solution or from a melt. These materials do not have the disadvantages normally encountered with high molecular weight polyaniline such as decomposition below the softening or melting point and insolubility.

The preferred inorganic electrochromic materials would be solid materials such as $WO_3$ and Prussian blue mixed with a conductive material such as indium-tin oxide powder. The preferred organic material would be polyaniline.

Electrical conductivity can be provided or enhanced in an electrochromic material by mixing the electrochromic material with a conductive powder, depositing the electrochromic material on a conductive substrate or coating the electrochromic material on an electrically conductive material. Examples of suitable conductive materials include metals such as nickel, copper or aluminum and metal oxides such as tin oxide, indium-tin oxide or antimony-tin oxide. Electrochromic materials that are substantially non-conductive can be placed in a matrix of electrically conductive particles, e.g., a sintered matrix of metal powder so that the overall matrix is conductive and the substantially non-conductive electrochromic material is in contact with the conductive matrix of particles. Preferably, transparent conductive powders are used, such as indium-tin oxide, along with an electrochromic material such as Prussian blue, tungsten trioxide, nickel oxide and the like. Such transparent conductive materials when used in association with the electrochromic material allow the color change by the electrochromic material to be readily observed. In another embodiment, the electrochromic material may be deposited on the surface of optically transparent conductive powders by a chemical, electrochemical, precipitation, vapor or other suitable means. Although the use of a transparent conductive powder is preferred, it is possible to use a non-transparent conductive material; however, the visual effect of the electrochromic transition is limited to the surface of the electrode in this embodiment. Electroconductive particles can be provided comprising electrically conductive non-metallic particles coated with electrochromic material as disclosed in U.S. Pat. No. 5,413,739. Such non-metallic particles can comprise carbon particles or electrically conductive metal compound, e.g., metal oxide or metal salt, particles. Alternatively, the electrically conductive non-metallic particles can comprise a conductive material, e.g., doped metal oxide, coated on a non-conducting substrate, e.g., mineral particles such as titanium dioxide. Where sharply contrasting images are desired, it is preferred that the particles be transparent or lightly colored so as to not interfere with visibility of electrochromic effects. Preferred electrically conductive material includes doped tin oxide such as antimony-doped tin oxide (ATO), indium-doped tin oxide (ITO) or halogen-doped tin oxide, e.g., fluorine-doped tin oxide (FTO). Useful electrochromic materials for coating the electrically conductive material include polyaniline, polypyrrole, polythiophene, polyvinylferrocene, polyviologen, tungsten oxide, indium oxide, molybdenum oxide, nickel oxide and Prussian blue.

The electrically conductive electrodes can be any material that can conduct an electrical current. The electrode opposite to the electrode at which the electrochromic material will undergo its color change is called the counter electrode. The counter electrode for use in this invention can be a metal, a metal oxide or an organic or polymeric conductor. Suitable materials for use as a counter electrode can be carbon, silver, copper and the like. If the housing of the electrochemical cell is electrically conductive, it can also act as the counter electrode. The counter electrode could also have electrochromic material in contact with it, or be of the same electrically conductive material as the working electrode. Polyaniline and polypyrrole are suitable for this construction. In this embodiment, the working and counter electrodes can provide contrasting visible changes to enhance the visual effect. The counter electrode is separated from the working electrode by an electrolyte, and could be painted, printed, sprayed or deposited in contact with the electrolyte using any conventional technique. The counter electrode in the electrochromic cell testing label poises the overall electrochromic cell potential at the correct level for the eletrochemical cell or battery to be tested. Preferably, it also serves as a site for electrochemical activity.

Ionically conductive electrolyte materials suitable for use in the electrochromic state of charge indicator incorporated into the label according to this invention can be inorganic or organic, liquid or solid, or combinations thereof. Polymer electrolyte materials such as poly-2-acrylamido-2-methyl propanesulfonic acid [poly(AMPS)], polystyrene sulfonic acid or polymers containing effective amounts of aqueous or nonaqueous electrolytes so as to form an ionically conductive gel are examples. The electrolyte should have sufficient ionic conductivity to operate the indicator. It is preferred that the electrolyte be a polymer or gel electrolyte which can be applied by a high speed printing or coating process. More preferably, the electrolyte can contain a pigment such as titanium dioxide, substituted titanium dioxides to provide color, contrast and various shades of yellow, or other inorganic or organic pigments.

In a preferred embodiment, the electrolyte can be a composition comprised of electrochromic material. The electrochromic material can be a solute or salt dissolved in a solvent for the electrolyte. Alternatively, the electrochromic material can be a dispersion of electrochromic particles in an electrolyte carrier. In yet another alternative, the electrochromic material can undergo a redox reaction to produce a substance that interacts with a substance in the electrolyte to provide the visible change. Another embodiment includes the electrochemichromic systems such as those found in U.S. Pat. No. 4,902,108, issued Feb. 20, 1990, to Harlan J. Byker, which is incorporated herein by reference. These include N,N,N'-tetramethyl-1,4-phenylenediamine; 5,10-dihydro-5,10-dimethylphenazine and N,N',N"-trimethyltriphenazinoxazine. Phenolphthalein, methyl violet or ethyl red provide an indicative color change through the oxidation and reduction of the solvent (e.g., $H_2O$). As described above, the electrochromic material may not itself undergo a redox reaction but instead reacts with another species, e.g., protons from water, which are produced by the redox reaction. The electrochemichromic solution can also be thickened by using polymeric thickeners such as polymethylmethacrylate, polyethylene oxide, poly-2-acrylamido-2-methyl propanesulfonic acid [poly(AMPS)] or the like.

In the embodiment wherein the electrochromic material and electrolyte are components of a composition, the electrically conductive electrodes can be made of the same material, i.e., the same metal, metal oxide, carbon, or polymer. As current from the battery is passed through the indicator, the electrochromic material can undergo its visible change at the electrode in contact with the negative terminal of the battery being tested.

The electrically conductive electrodes, electrochromic material and electrolyte can be disposed in a variety of ways on a substrate of the label in the appropriate order. Suitable ways include electrolysis, vapor deposition, any of the known printing methods and techniques, coating, painting, and the like. The thickness of the working electrode could vary from 0.1 to 250 microns, preferably from 2 to 100 microns and most preferably from 10 to 30 microns. The thickness of the electrolyte can range from 0.1 to 250 microns, preferably from 2 to 100 microns and more preferably from 10 to 30 microns. The thickness of the counter electrode can range from 0.1 to 250 microns, preferably from 2 to 100 microns and more preferably from 10 to 30 microns. The total thickness of the state-of-charge testing device can vary in thickness from 0.3 to 750 microns, and preferably from 6 to 300 microns.

In one method for making the labels with the incorporated state-of-charge indicator, first and second substrates are used. A first electrically conductive material can be disposed in a pattern on the first substrate, and the second electrically conductive layer can be disposed in a pattern on the second substrate. The ionically conductive electrolyte can then be applied onto the first or second eletrically conductive patterns. The electrochromic material can be in combination with one of the first or second electrically conductive materials, it can be deposited on one of the first or second electrically conductive patterns, or it can be in composition with the electrolyte. The first and second substrates are then brought together so that the electrolyte and electrochromic material are sandwiched between the two substrates.

Figure 1:
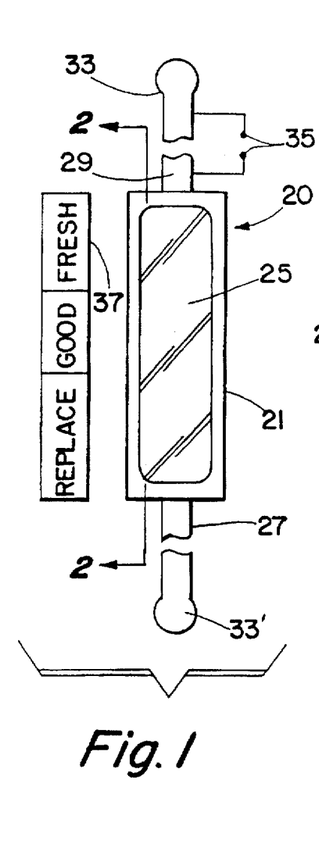
FIG. 1 is a schematic elevational view of the tester label of the present invention accompanied by a scale for comparing the color of the indicating device and determining the state of charge of the cell.

Referring to FIG. 1, an embodiment of an electrochromic state of charge indicator incorporated into a label according to this invention is shown and indicated generally by the number 20. The label has a transparent or translucent film cover 21 for containing the several components of the indicator. The translucent or transparent film 21 is placed over electrically conductive electrochromic electrode 25 so that it can be viewed. Electrical conductors 27 and 29 extend from each end of the cell tester 20. Conductor 27 is shown as being of indeterminate length and has a terminal 33 for connection to an external terminal of a battery with its opposite end connected to one of the electrodes of cell tester 20. Likewise, the conductor 29 is shown of indeterminate length and has a terminal 33 for connection to the opposite terminal of the battery to be measured and its opposite end is connected to the counter electrode of cell tester 20. A switch is schematically illustrated at 35 which can be used to connect the cell tester 20 across the terminals of a battery being tested. A color scale 37 can be mounted on the housing of the cell tester 20 for providing a ready color comparison for the electrochromic material to determine the state-of-charge of the battery.

Figure 2:
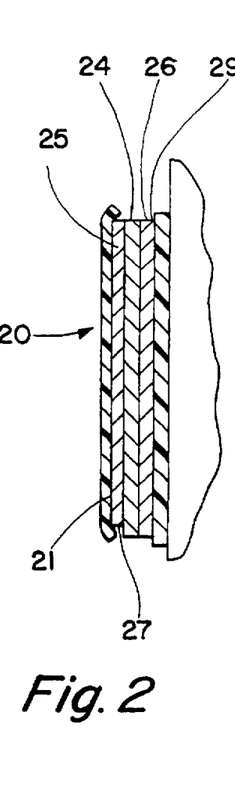
FIG. 2 is a sectional view taken along the line II—II of FIG. 1.

In FIG. 2, the cell tester 20 is shown mounted on or adhered to the housing of an electrochemical cell or battery 39, only a portion of which is shown. In the example shown here, the cell tester 20 comprises a transparent or translucent film substrate 21, a counter electrode 26 disposed on a film 31 which is disposed or adhered to the housing of the battery 39, an ionically conducting electrolyte layer 24 disposed between counter electrode 26, and electrically conductive electrochromic working electrode 25. Battery terminal connector 27 places electrode 25 in electrical contact with one terminal (not shown) of the battery, and battery terminal connector 29 places electrode 26 in electrical contact with the other terminal (not shown) of the battery. In this FIG. 2, the electrically conductive electrochromic working electrode 25 undergoes a visible change. As such, the electrically conductive electrochromic electrode 25 is a composite of an electrical conductive material and an electrochromic material. Alternatively, as will be discussed further regarding FIG. 10, the electrochromic material can be deposited as a separate layer in contact with a layer of electrically conductive material to form electrode 25. In yet another alternative, the electrochromic material can be in composition with the electrolyte 24, and be deposited onto electrode 25 as current from the battery is passed through the indicator. As an alternative for counter electrode 26, it can be part of a second substrate for the battery label with the working electrode 25 being deposited on the first label substrate. Or, as will be discussed further regarding FIG. 11, counter electrode 26 can be part of or disposed directly on the battery housing. If it is part of the battery housing, then electrical conductor 29, would not be required since the counter electrode would be part of the terminal of the battery being tested.

If the electrochromic material forms part of the electrolyte 24, then electrode 26 can be the working electrode by having the electrochromic material deposit onto electrode 26 as current passes through the indicator. In this embodiment, electrode 25 is the counter electrode, and if the indicator is in the form of stacked layers, electrode 25 and electrolyte 24 are preferably transparent so that the visible change in the electrochromic material occurring at electrode 26 can be viewed.

Figure 3:
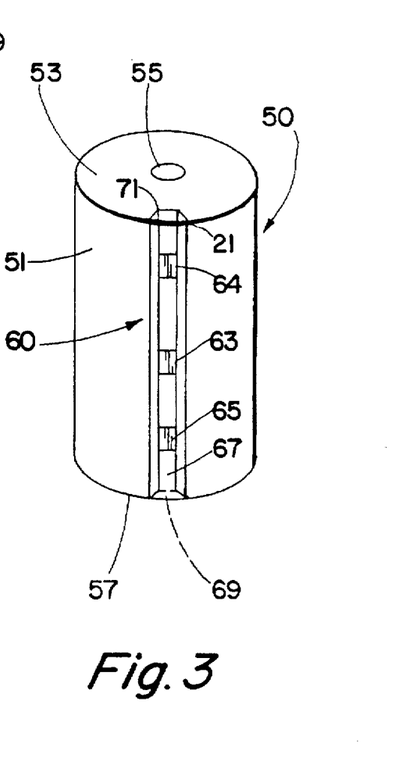
FIG. 3 is a perspective view of a battery having the tester label mounted on a housing.

Referring to FIG. 3, a typical C or D size dry cell battery is shown and indicated generally by the number 50 and has an indicator incorporated into the label for the battery. The indicator has more than one electrochromic tester to indicate different states of charge for the battery. A typical battery has a cylindrical housing 51 and an end cover 53 in contact with positive terminal 55. The opposite end cover is indicated by 57. A label having an electochromic tester 60 incorporated therein is disposed and adhered on the side of housing 51. In FIG. 3, three tester cells, similar to tester cell 20 of FIG. 1 are shown. Cell 64 can be poised to indicate a fresh battery. Cell 63 can be of a similar construction, however, it can be poised to a different voltage to indicate a good condition of the battery, while cell 65 is again of similar construction but is poised to yet another voltage to indicate that the battery should be replaced. Cells 63, 64 and 65 can be poised to the different voltage by using different electrochromic electrodes. Alternatively, cells 63, 64, and 65 can have the same electrochromic material and can be used to indicate different states of battery discharge with appropriate circuit components, such as, for example diodes, load resistors and voltage dividers. Cell 65 is connected to the negative end cover 57 by means of a conductive strip of material 67 which is folded under and has a contact 69. At the opposite end of the cell label tester, a conductor 71 completes the connection to the positive terminal of the battery. Alternative means of making contact, such as by using a resilient pressure switch, between the electrochromic label tester cell or cells and the battery terminals may be used.

As shown in FIG. 3, the label cell tester is continuously in contact with the negative and positive external terminals of the battery. When used in such applications, it is preferred to use a solid state electrochromic tester. The components of this tester, i.e., the working electrode, the counter electrode, the electrochromic material and the electrolyte, can be in the form of layers which are applied as coatings over or printed on the inner surface of the transparent film 21 shown in FIG. 1. Solid state electrochromic testers tend to draw substantially less current than solution electrochromic materials. When the latter materials are used, it is preferred to use a suitable switch such as switch 35 (FIG. 1) to momentarily connect the cell tester label across the terminals of the battery. The battery then drives the electrochromic material to a different oxidation state causing the electrochromic material to undergo a visible change. After the change is noted or the reading is complete, the switch should be opened to electrically isolate the battery from the cell tester label.

Figure 4:
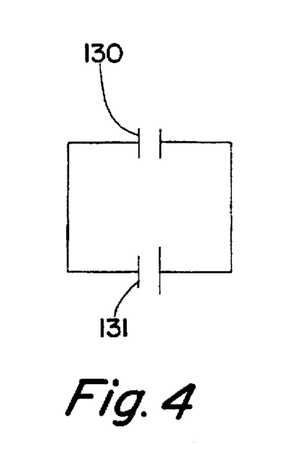
FIG. 4 is a simplified schematic of the electrochromic tester connected for an open circuit test of a battery.
Figure 5:
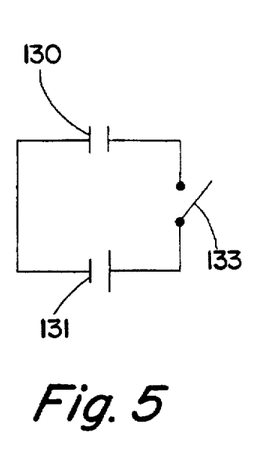
FIG. 5 shows the simplified schematic of FIG. 4 with a switch added to isolate the tester label device from the electrochemical cell.

Since the cell tester label does draw current, it is preferred to have some type of an external switch to isolate it from the battery. The cell tester label can be used in either an open circuit or a closed circuit mode. In the closed circuit mode the voltage of the battery is tested under load. FIGS. 4 and 5 show a typical open circuit configuration for testing a battery. In FIG. 4, electrochromic cell 130 is connected in series with battery 131 to be tested. In FIG. 5, electrochromic cell 130 is again connected to battery 131; however, in this circuit a switch 133 is used to take the electrochromic cell out of the circuit so as not to discharge the battery. It can be seen in the open circuit test that no load other than the electrochromic cell itself is placed across the terminals of the battery being tested.

Figure 6:
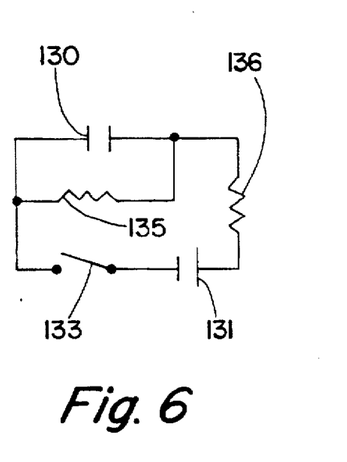
FIG. 6 is a simplified schematic of a closed circuit tester label device.

FIG. 6 represents a typical closed circuit test in which a load resistor 135 is placed across the electrochromic cell 130. An additional load resistor 136 can be used, if desired, to form a voltage divider circuit and provide additional control or to give the tester a scale effect. The battery 131 is again connected for testing or isolated by a switch 133. In the open circuit measurement circuit, as shown in FIGS. 4 and 5, the electrochromic cell should be poised to sense the range of voltage produced by the battery 131. When a different voltage range is produced by different types of batteries, different electrochromic electrodes can be used in the electrochromic cell. In the circuit of FIG. 6, the load resistor 135 can be varied to match the electrochromic cell 130 to the potential produced by the battery 131 in addition to selection of the appropriate electrochromic electrode. The load resistors 135 and 136 can be formed by using portions of the electrochromic electrode. Such an electrochromic electrode can be shaped or patterned to vary the resistance and serve as the load along which the potential decreases.

Figure 7:
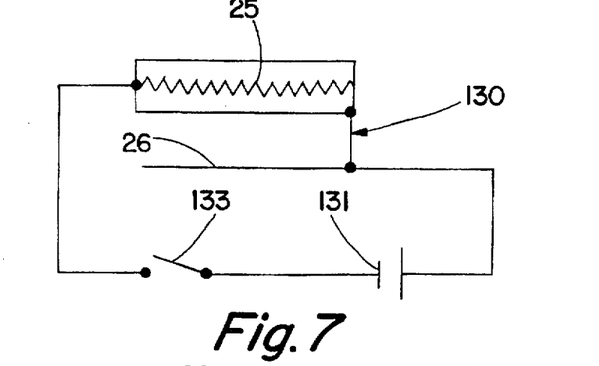
FIG. 7 is a simplified schematic of a tester label employing a resistive load which can be the electrochromic electrode of the electrochromic cell.

The selection and matching of the voltage range of the electrochromic electrode can thus be largely avoided by using a testing circuit such as those shown in FIGS. 6 and 7. In FIG. 7, the resistivity of the electrochromic electrode provides the resistive load and, in combination with the electrochromic cell 130, acts as a voltage divider. In this cell, the voltage drop across the electrodes of the electrochromic cell tester varies from the closed circuit voltage obtained at the left end of the electrochromic cell, as shown in FIG. 7, to a lower voltage (possibly zero volt) at the other end. With this type of indicator, the state-of-charge of the cell is determined by the position of the color in the electrochromic device.

Figure 8:
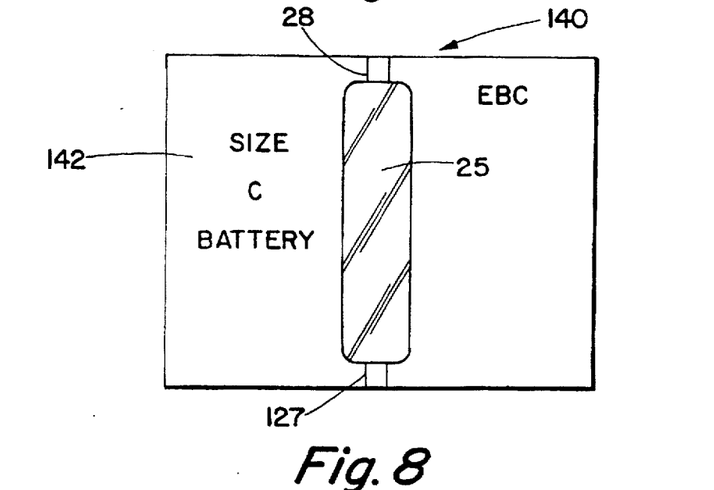
FIG. 8 is a partial elevational view of a label for a battery including a printed tester label of this invention.
Figure 9:
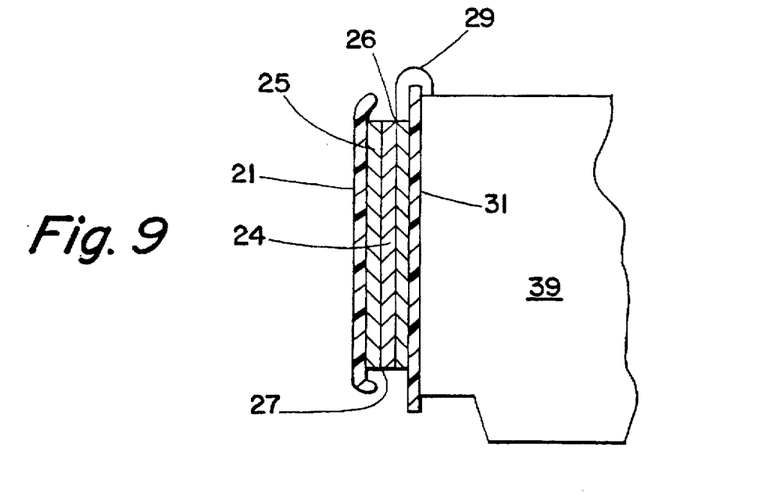
FIG. 9 is a partial sectional view showing the cell tester label of FIG. 8 applied to a battery.

FIGS. 8 and 9 show the several components of the cell tester applied as part of the label indicated generally by 140 using the same reference numbers for the same components shown in FIG. 1. During the label printing process appropriate graphics 142 can be applied to one part, layer, film, or substrate of the label. For example, the components of the cell tester can be provided by various means such as by printing, coating or depositing the components in a preselected order on a label substrate using conductive ink or paint. The label tester can be prepared so that one electrode of the tester is in electrical contact with one external terminal of the battery and the other electrode is in electrical contact with the opposite terminal of the battery. Either electrical conductor 27 or 29, or both, can be printed on the same or a different substrate of the label so that it terminates near one external terminal of the battery without making electrical contact. The open circuit can then be closed by bringing that electrical conductor on the label which is near one terminal of the battery into contact with that terminal to activate the tester. After testing is complete, the conductor can be released to once again be out of electrical contact with the battery terminal. Thus, by placing the conductor out of contact with the battery terminal a switch is provided. The conductor can be placed directly in contact with the terminal, or it can be connected to the terminal by a separate agent such as a finger, or electrical conductive material. If desired, one conductor can be printed so that it will make electrical contact with a terminal of the battery when the label is applied.

Figure 10:
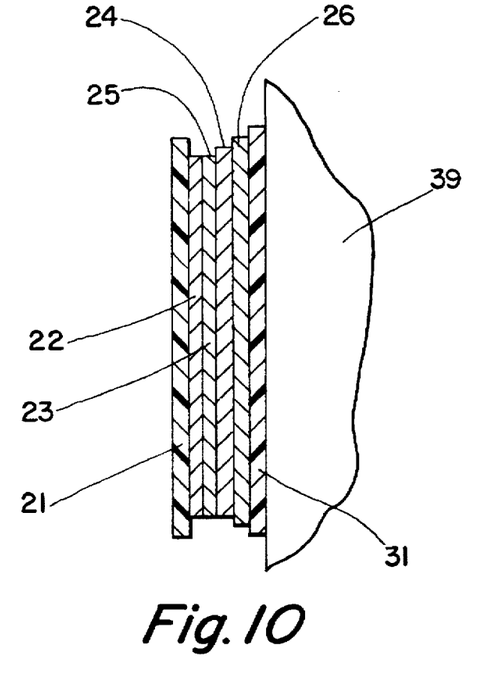
FIG. 10 is a partial sectional view showing an alternative tester label applied to an electrochemical cell.

In FIG. 10, the components of the cell tester use the same reference numerals for the same components shown in FIG. 2. Electrically conductive electrochromic electrode 25 is a combination, for example a composite laminate, of electrochromic material 23 and electrically conductive material 22. Polymer film 21 is disposed over electrode 25, and electrolyte 24 is between electrode 25 and electrode 26. Label substrate 31 is next or adhered to the housing of battery 39 and supports electrode 26.

Figure 11:
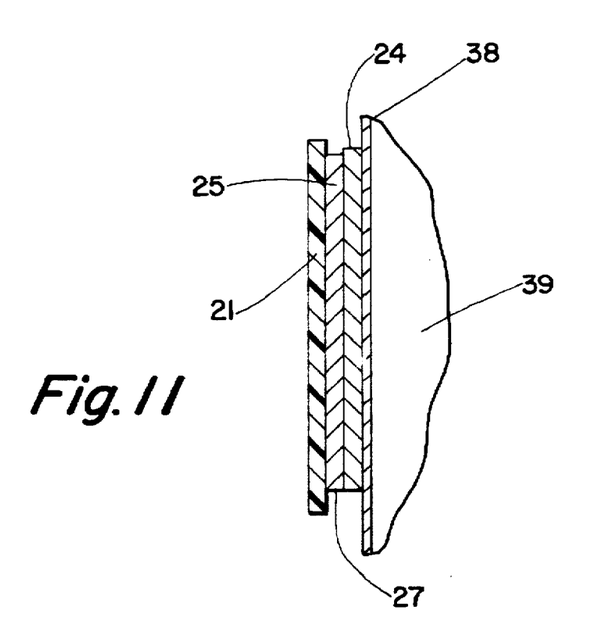
FIG. 11 is a partial sectional view showing an alternative tester label applied to an electrochromic cell.

In FIG. 11, the components of the cell tester use the same reference numerals for the same components shown in FIG. 2. Housing 38 of battery 39 is electrically conductive and provides the counter electrode for indicator 20. In this embodiment, electrically conductive electrochromic electrode 25 and electrolyte 24 are disposed on film 21. Film 21 can be a substrate or a layer of a label adhered or covering the housing 38. The label can have additional layers which would have openings in them to allow electrolyte 24 to contact housing 38. In an alternative construction, electrolyte 24 could be applied to housing 38, and electrode 25 could be disposed on a layer of the label. In the embodiment shown in FIG. 11, only one electrical connector 27 is needed and would connect indicator 20 with the terminal of opposite polarity to the terminal in contact with the housing 38. In a typical alkaline cell, connector 27 would connect with the negative terminal of the cell.

In the manufacture of the label tester, it is preferred to use a web of the substrate material which can hold many labels and run the web through suitable printing operations or coating operations where the graphics for each label can be applied to the web along with each layer of the tester. After the label tester has been applied, the web of material can be run through a suitable punch or die cutting operation to separate the individual labels from the web so that the labels can be applied to batteries in the finishing of the battery during the heat shrinking of the label.

From the above description it can be seen that a indicator incorporated into the label can be provided for testing the state of a battery which can be applied to the housing of the battery and left in place at all times. Since the device does not rely on heat, the thermal mass of the battery will not effect the operation of the device. When the electrical circuit for the testing device is completed, the electrochromic electrode will undergo a visible change, such as a change of color, to indicate the state of the cell.

Though the invention has been described with respect to a specific preferred embodiment thereof, many variations and modifications will become apparent to those skilled in the art. It is therefore the intention that the appended claims be interpreted as broadly as possible in view of the prior art to include all such variations and modifications.

What is claimed is:

1. A label having an incorporated state-of-charge indicator for an electrochemical cell, said electrochemical cell having a first terminal and a second terminal of opposite polarity; said indicator comprising a first electrically conductive electrode adapted to electrically contact said first terminal, said first electrically conductive electrode being comprised of an electrochromic material to form an electrically conductive electrochromic electrode, a second electrically conductive electrode adapted to electrically contact said second terminal, and an ionically conductive electrolyte disposed between and in contact with said first and second electrically conductive electrodes; wherein said electrochromic material will undergo a visible change as a result of current being supplied from the electrochemical cell.

2. The label of claim 1, wherein the first electrically conductive electrode is a composite of electrically conductive material and electrochromic material.

3. The label of claim 1 wherein the label is comprised of a substrate, the state-of-charge indicator being disposed thereon.

4. The label of claim 1 wherein the electrochromic electrode comprises at least one inorganic electrochromic material.

5. The label of claim 4 wherein the inorganic electrochromic material is selected from the group consisting of $WO_3$, $MoO_3$, $TiO_2$, $SnO_2$, $Cr_2O_3$, $NiO_2$, $MnO_2$, $Mn_2O_3$, and Prussian blue.

6. The label of claim 1 wherein the electrochromic electrode comprises at least one organic electrochromic material.

7. The label of claim 6 wherein the organic electrochromic material is selected from the group consisting of macrocyclic and polycyclic materials.

8. The label of claim 6 wherein the organic electrochromic material is selected from the group consisting of substituted and unsubstituted phthalocyanines, polypyrroles, and polyanilines.

9. The label of claim 6 wherein the organic electrochromic material is polyaniline.

10. The label of claim 6 wherein the organic electrochromic material is polypyrrole.

11. The label of claim 1 wherein said electrically conductive electrochromic electrode further comprises an electrically conductive material selected from the group consisting of metal powder and metal oxide powder.

12. The label of claim 1 wherein the ionically conductive electrolyte comprises a material selected from the group consisting of organic materials.

13. The label of claim 12 wherein the ionically conductive electrolyte material is poly-2-acrylamido-2-methyl propanesulfonic acid.

14. The label of claim 13 wherein the electrochromic material comprises at least one inorganic electrochromic material selected from the group consisting of $WO_3$, $MoO_3$, $TiO_2$, $SDO_2$, $Cr_2O_3$, $NiO_2$, $MDO_2$, $MD_2O_3$, and Prussian blue.

15. The label of claim 12 wherein the electrochromic material comprises at least one organic electrochromic material selected from the group consisting of substituted and unsubstituted phthalocyanines, polypyrroles, and polyanilines.

16. The label of claim 1 wherein the electrochromic electrode is polyaniline, the second electrically conductive electrode is copper, and the ionically conductive electrolyte is poly-2-acrylamido-2-methyl propanesulfonic acid.

17. The label of claim 13 wherein the electrochromic material is Selected from the group consisting of a mixture of $WO_3$ and indium-tin oxide and a mixture of Prussian blue and indium-tin oxide.

18. The label of claim 17, wherein one of the electrically conductive electrodes is copper.

19. The label of claim 3 wherein the substrate is a polymer film and the electrochromic electrode is printed on the polymer film, the ionically conductive electrolyte is printed on the electrochromic electrode and the second electrically conductive electrode is printed on the ionically conductive electrolyte.

20. The label of claim 3 wherein the substrate is a polymer film and the electrochromic electrode is printed on the polymer film, the second electrically conductive electrode is printed on the polymer film, and the ionically conductive electrolyte is printed in contact with both the electrochromic and second electrically conductive electrode.

21. The label of claim 3 wherein the substrate is a polymer film and the electrochromic electrode is printed on the polymer film, the second electrically conductive electrode is printed on a second substrate of the label, and the ionically conductive electrolyte is disposed between the polymer film substrate and the second label substrate and in contact with both the electrochromic and second electrically conductive electrodes.

22. The label of claim 1 wherein the electrically conductive electrochromic electrode is polyaniline or polypyrrole and the second electrically conductive electrode is selected from the group consisting of polyaniline, and polypyrrole.

23. The label of claim 1 being adhered to a housing of the electrochemical cell.

24. The label of claim 21 wherein one of the polymer film or the second substrate has means for adherence to a housing of the electrochemical cell.

25. The label of claim 3 further comprising a second substrate having graphics disposed thereon.

26. The label of claim 25 being adhered to a housing of the electrochemical cell.

27. The label of claim 23 wherein the housing is electrically conductive and the second electrically conductive electrode is a part of the housing of the electrochemical cell.

28. An electrochemical cell having a label with a state-of-charge indicator incorporated in the label, said electrochemical cell having first and second terminals of opposite polarity, and wherein the label comprises a substrate, an electrically conductive electrochromic electrode deposited on the substrate and adapted to electrically contact the first terminal of the of the cell, an ionically conductive electrolyte disposed in contact with the electrochromic electrode, an electrically conductive counter electrode disposed in contact with the electrolyte and adapted to electrically contact the second terminal of the cell; wherein when the electrochromic electrode makes electrical contact with the first terminal of the cell and the counter electrode makes contact with the second terminal of the cell, the electrochromic electrode will exhibit a visible change as a result of a chemical reaction.

29. A process for preparing a label with a state of charge indicator incorporated therein, the process comprising:

a) disposing a first electrically conductive material on a first substrate for the label;

b) disposing a second electrically conductive material on a second substrate for the label such that when the first substrate and second substrate are combined, the first electrically conductive material and the second electrically conductive material will be spaced apart to provide an opening between them;

c) disposing an electrochromic material in contact with at least one of the electrically conductive materials; and d) disposing an ionically conductive electrolyte in the opening between and in contact with said electrochromic and electrically conductive materials; and e) combining the first substrate and second substrate such that the first conductive material, second conductive material, the electrochromic material and electrolyte are in registration to provide an electrochromic state of charge indicator.

30. The process of claim 29 wherein the electrochromic material is disposed on one of said electrically conductive materials and the electrolyte is disposed on the other prior to combining the first substrate and second substrate.

31. The process of claim 30 wherein the electrochromic material forms a composite with at least one of the electrically conductive materials.

32. A process for preparing a label with a state of charge indicator incorporated therein, the process comprising:

a) disposing a first electrically conductive material on a first substrate for the label;

b) disposing a second electrically conductive material on a second substrate for the label such that when the first substrate and second substrate are combined, the first electrically conductive material and the second electrically conductive material will be spaced apart to provide an opening between them;

c) disposing an electrochromic material in contact with at least one of the electrically conductive materials;

d) disposing an ionically conductive electrolyte in the opening between and in contact with said electrochromic and electrically conductive materials; and e) combining the first substrate and second substrate such that the first conductive material, second conductive material, the electrochromic material and electrolyte are in registration to provide an electrochromic state of charge indicator; said electrochromic material forming a composition with the electrolyte.

33. The process of claim 29 wherein the first conductive material and second conductive material are in a stacked arrangement when the first substrate and second substrate are combined.

34. A process for preparing a label with a state of charge indicator incorporated therein, the process comprising:

a) disposing a first electrically conductive material on a first substrate for the label;

b) disposing a second electrically conductive material on a second substrate for the label such that when the first substrate and second substrate are combined, the first electrically conductive material and the second electrically conductive material will be spaced apart to provide an opening between them;

c) disposing an electrochromic material in contact with at least one of the electrically conductive materials;

d) disposing an ionically conductive electrolyte in the opening between and in contact with said electrochromic and electrically conductive materials; and e) combining the first substrate and second substrate such that the first conductive material, second conductive material, the electrochromic material and electrolyte are in registration to provide an electrochromic state of charge indicator;

said electrochromic material being disposed on one of said electrically conductive materials and the electrolyte being disposed on the other prior to combining the first substrate and second substrate;

said first conductive material and second conductive material being in a side-by-side arrangement when the first and second substrates are combined.

35. The process of claim 29 wherein the first conductive material, second conductive material, electrochromic material and electrolyte are a series of printed layers.

36. The process of claim 29 wherein the first and second substrates are combined by laminating the first and second substrates together.

37. The label of claim 2 wherein said electrically conductive electrochromic electrode is an electrically conductive matrix containing said electrochromic material dispersed homogeneously throughout and in contact with said matrix.

38. The label of claim 2 wherein said electrochromic material is coated on electrically conductive particles.

39. The label of claim 1 wherein the electrically conductive electrochromic electrode is polyaniline or polypyrrole and the second electrically conductive electrode is copper.

40. The label of claim 1 wherein the ionically conductive electrolyte comprises a material selected from the group consisting of inorganic materials.

41. The label of claim 40 wherein the electrochromic material comprises at least one organic electrochromic material selected from the group consisting of substituted and unsubstituted phthalocyanines, polypyrroles, and polyanilines.

* * * * *